United States Patent [19]

Wilson et al.

[11] 4,313,072
[45] Jan. 26, 1982

[54] LIGHT MODULATED SWITCHES AND RADIO FREQUENCY EMITTERS

[75] Inventors: Mahlon T. Wilson; Paul J. Tallerico, both of Los Alamos, N. Mex.

[73] Assignee: The United States of America as represented by the United States Department of Energy, Washington, D.C.

[21] Appl. No.: 83,484

[22] Filed: Oct. 10, 1979

[51] Int. Cl.³ .............................................. H01J 25/02
[52] U.S. Cl. .......................................... 315/5; 313/95; 315/4; 328/232
[58] Field of Search ...................... 315/150, 4.5, 4, 5; 307/311, 312; 313/94, 94 X, 106, 95; 250/215; 350/96.13; 331/81–84; 328/232

[56] References Cited

U.S. PATENT DOCUMENTS 3,403,257  9/1968  Petroff ................................. 315/5
3,931,595  1/1976  Isaacs et al. ...................... 350/96.13

*Primary Examiner*—Harold A. Dixon
*Attorney, Agent, or Firm*—Robert W. Weig; Paul D. Gaetjens; Richard G. Besha

[57] ABSTRACT

The disclosure relates to a light modulated electron beam driven radiofrequency emitter. Pulses of light impinge on a photoemissive device which generates an electron beam having the pulse characteristics of the light. The electron beam is accelerated through a radiofrequency resonator which produces radiofrequency emission in accordance with the electron, hence, the light pulses.

11 Claims, 3 Drawing Figures

4,313,072

LIGHT MODULATED SWITCHES AND RADIO FREQUENCY EMITTERS

BACKGROUND OF THE INVENTION

Field of the Invention

The invention relates to radiofrequency generation and more particularly to light modulated electron beam driven radiofrequency emission.

Various type of devices which generate radiofrequency power at wavelengths between about 10 and 200 centimeters (cm) are known. Those which utilize linear electron beams are divisible into 3 general types. The first type comprises devices employing longitudinal compression or bunching of the electron beam. The second type comprises devices utilizing radiofrequency deflection of an electron beam and the third type comprises devices utilizing a grid to vary the density of an electron beam.

Systems of the first type, such as the klystron and traveling wave tubes, employ beam velocity modulation. The overall length of the device must be proportional to the wavelength generated which means that these devices must be quite long and complex for wavelengths longer than 100 cm. Furthermore, the maximum ratio of radiofrequency power generated to direct current power consumed in such devices is approximately 0.7. It will be appreciated by those skilled in the art that a higher ratio is desirable for large high-power radiofrequency systems.

The devices of the second type, i.e., those using radiofrequency deflection of the electron beam such as the gyrocon, provide higher direct current to radiofrequency conversion efficiencies, on the order of 0.8. However, devices of this type in the 100-200 cm range are large, heavy and complex.

Devices in the third category, those utilizing a grid to vary the density of an electron beam, such as the triode and tetrode gridded electron tubes, provide only limited power from single devices. The overall direct current to radio-frequency conversion efficiency is lower than for the first two types of devices, 0.65 at best.

The present invention provides novel generation of large amounts of radiofrequency power in the 10-200 cm wavelength range in an inexpensive and compact apparatus that has high efficiency.

Objects of the Invention

One object of the present invention is to efficiently produce radiofrequency power in the decimeter to two meter wavelength range.

Another object of the present invention is to produce radiofrequency power at less cost utilizing a smaller less complex generation system than provided in the past for the decimeter to meter wavelength regions.

An advantage of the present invention is that embodiments in accordance therewith are of relatively small size.

Another advantage of the instant invention is that conversion efficiencies thereof are better than those offered by prior art devices. Due to the very good bunching possible at the longer wavelengths, electronic efficiencies above 90% are achievable. Overall efficiency will depend on the efficiency of the laser, and should be between about 80% and 90% in well designed systems.

SUMMARY OF THE INVENTION

In accordance with the present invention there is provided a light modulated electron beam driven radiofrequency emitter comprising a light emitting structure such as a laser capable of providing pulses of light for predetermined times at preselected intervals. The light is received by a photo-emissive device which generates an electron beam having a pulse width and repetition rate in accordance with the pulse width and pulse intervals of the light received from the light source. A reduced pressure providing environment surrounds at least the photoemissive device and may include the light source. A radiofrequency resonator having a cavity is located within the environment and the electron beam is accelerated therethrough by, for example, an electric field. A conduit is provided for conducting outside the environment the radiofrequency energy generated by the electron beam passing through the resonator. The environment may be provided by a conventional vacuum chamber. A frequency shifter may be employed between the light source and the photoemissive surface to provide light waves of the most desirable frequency for emitting electrons from the surface of the photoemitter.

BRIEF DESCRIPTION OF THE DRAWINGS

Other objects and advantages of the present invention will be apparent to those skilled in the art from the following description with reference to the appended drawings wherein like numbers denote like parts and wherein.

DESCRIPTION OF A PREFERRED EMBODIMENT

Figure 1:
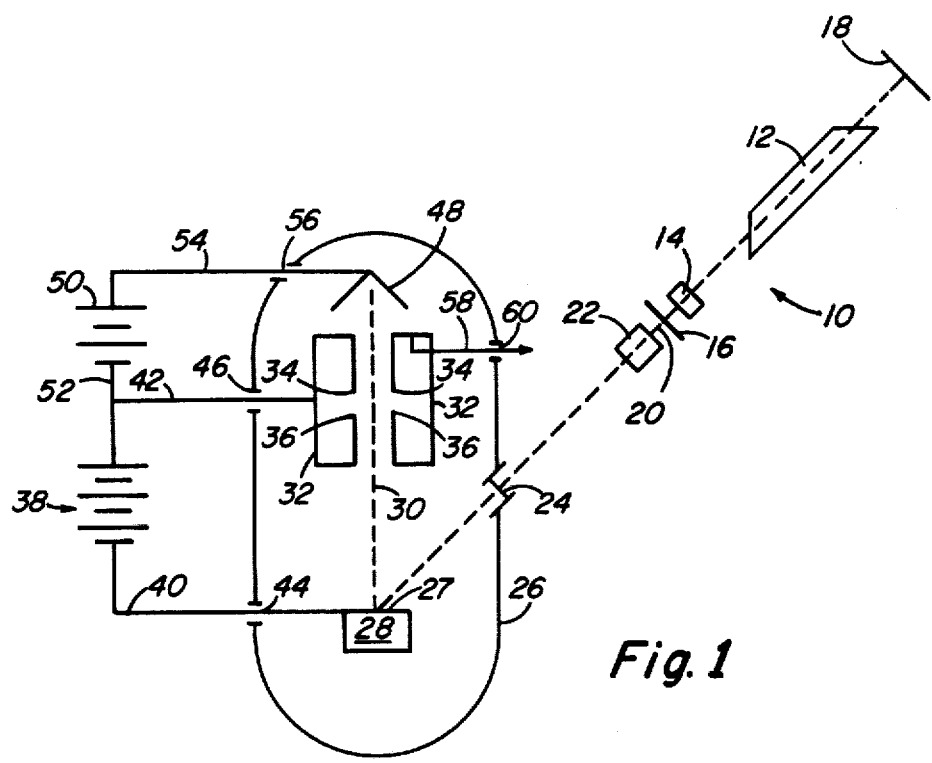
FIG. 1 shows a preferred embodiment in accordance with the invention.

Reference is now made to the preferred embodiment illustrated in FIG. 1, showing a light source 10 which may comprise, for example, a laser 12, mirrors 16 and 18, and modelock 14.

Laser 12 emits light in pulses determined by a modelocking device 14 which may be, for example, an electrooptical or acoustooptical modulator, or a passive dye cell. Modelocking device 14 suppresses the plurality of optical modes that may exist between the mirrors thereby enhancing the energy content of the dominant mode. This forms a pulse of light that moves back and forth between the mirrors 16 and 18. Mirror 16 is partially transmitting to allow part of each light pulse to exit the source 10 as a useful light beam.

Light source 10 produces a light beam 20 which may be frequency altered by a frequency shifter 22 such as an ammonium dihydrogen phosphate (ADP) crystal. The beam 20, which may or may not be passed through a frequency shifter 22, passes through a window 24 such as a quartz window in a reduced pressure environment providing device 26 such as a vacuum chamber.

The photocathode and electron beam must be in a vacuum of less than $1.0 \times 10^{-6}$ torr. The vacuum chamber 26 should comprise metal to eliminate microwave and x-radiation in undesired directions. After passing through window 24 beam 20 strikes the surface 27 of a piece of photoemissive material 28. In response thereto, photoemissive material 28 generates an electron beam 30 having a pulse width and frequency in accordance with the pulse width and frequency of the light beam 20.

Figure 2:
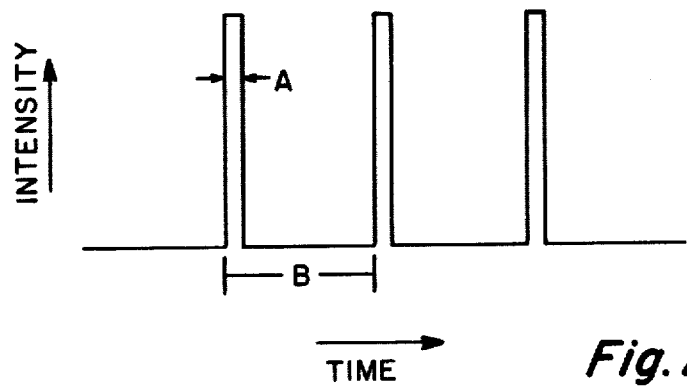
FIG. 2 graphically depicts the light pulses generated by the light source of the preferred embodiment.
Figure 3:
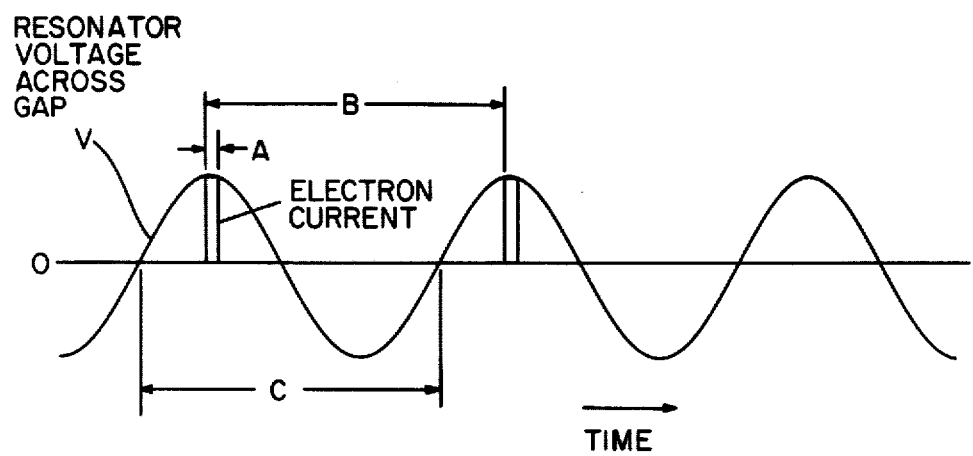
FIG. 3 illustrates the relationship between the electron current and the radiofrequency output within the preferred embodiment of FIG. 1.

FIG. 2 shows the width "A" of light pulses, which are emitted at time intervals "B". The pulse widths of the electron beam 30 are the same as those of the light beam 20 and also have pulse width "A" as seen in FIG. 3. The interval between the electron beam pulses is similarly referred to as interval "B" in FIG. 3. The electrons in beam 30 emitted from surface 27 are accelerated through a radiofrequency resonator 32, having a cavity and gap providing edges 34 and 36, by a high voltage provided between resonator 32 and photoemissive material 28 from a power supply 38 through electrical conducting lines 40 and 42 passing through the wall of vacuum chamber 26 at insulated electrical penetration locations 44 and 46. The resonant frequency of resonator 32 is the same as or is a harmonic of the pulsed frequency of the light beam 20. The acceleration of the electron beam by the power supply 38 increases its energy which is given up to resonator 32, which may be, for example, a microwave resonator such as is used in klystrons. Resonator 32 absorbs the kinetic energy from the rapidly moving electrons by creating radiofrequency oscillations within the resonator. The spent electrons with their remaining energy exit resonator 32 and are received by an electron collector 48. Their remaining energy is dissipated as heat from the collector. An additional power supply 50 may be connected by conductors 52 and 54 between collector 48 and resonator 32 to prevent secondary electrons from returning to the resonator 32 from the collector 48. Conductor 54 passes into the vacuum chamber through an insulating penetration location 56, conductor 52 sharing penetration location 46 with conductor 42.

Radiofrequency power is removed from the resonator 32 by interaction of the radiofrequency fields within the resonator itself with an iris or coupling loop 58 and exits through an insulated electrical penetration 60. The electrons produce electromagnetic radiation in the cavity as they are slowed down by the cavity field. The magnetic field in the cavity is primarily in the azimuthal direction and the coupling loop 58 is oriented perpendicular to the magnetic field to couple the cavity energy to an external radio-frequency load.

The source of light 10 may be incorporated within the vacuum enclosure or may be external as shown in the preferred embodiment. The frequency shifter 22 may be within the vacuum chamber even when the light source 10 is external thereof.

FIG. 2 shows the intensity of the light beam as a function of time and shows pulses "on" for a time "A" each time interval "B". The electron beam 30 has essentially the same structure, i.e., the same intensity with reference to time as the light beam 20.

Voltage "V" across the gap between points 34 and 36 on the resonator 32 may be depicted as the sine wave shown in FIG. 3 having a period "C". The electrons in beam 30 which excite the resonator and induce the voltage "V" are shown in FIG. 3 as traversing the gap cross edges 34 and 36 during the time period "A" and in the fundamental mode again after time interval "B" which is equal to the radiofrequency period "C".

The laser assembly or other form of light source 10 is tuned so that its light pulses 20 produce electron pulses 30 at the resonant frequency of resonator 32. The time interval "B" between pulses is determined by the spacing between mirrors 16 and 18. The pulse width "A" is determined by the characteristics of the laser 12 and the modelocking device 14. It is desirable to have the electron pulse width "A" a small fraction, less than about 15%, of the radiofrequency period "C". The time interval between pulses "B" must be an integral multiple of "C" which is determined by the volume of the resonator 32. The spacing between mirrors 16 and 18 or the volume of resonator 32 must be adjusted to make "B" an integral multiple of "C" and they both may be adjusted together to vary the output radiofrequency from conduit 60.

The upper limit of the output frequency of a light modulated radiofrequency emitter is determined by how close together mirrors 16 and 18 can be physically disposed. The present state of the art requires a mirror spacing on the order of 15 cm which results in a fundamental radiofrequency output of 1000 MHz. Higher frequencies can be obtained by reducing the volume of resonator 32 so that its new fundamental frequency is an integral fraction of the electron pulse interval "B". A lower limit of the output of this emitter is determined by physical size limitation and is in the range of tens of megahertz. Other emiter types become competitive at the lower frequencies meaning, in a practical sense, 80-100 MHz is the lower frequency limit.

In practicing the invention utilizing the preferred embodiment the light source preferably has a frequency in the ultraviolet range of the light spectrum and illuminates a metallic photoemissive surface 27 that possesses a low work function. Low work function materials require less optical energy to deliver each electron. Thus low work function materials are desirable for the photoemissive surface 27. Such emissive surfaces are obtained from the series I and II metals such as Li, Ma, Mg, K, Ca, Rb, Sr, Cs, and Ba and their alloys and compounds.

In an exemplary apparatus a deodymium-yag laser which discharges 1.17 ev light photons turned on for approximately 50 picoseconds by the modelock may be used. This produces a beam comprising packets "A", 1.5 cm long. The mirrors 16 and 18 are spaced 30 cm apart and cause the light packets to be spaced 60 cm apart, the packets being separated in time by 2 nanoseconds. The beam 20 passes through a frequency quadrupler 22 raising the photon energy to 4.68 ev and shortening the pulse length from 50 picoseconds to about 15 picoseconds. A quartz window is provided in the vacuum chamber which permits the beam 20 to fall upon a pure magnesium surface 27 that is cooled by water circulating within the walls of its support. Since magnesium has a photoelectric threshold of approximately 3.7 ev, electrons are emitted from the surface in pulses essentially the same as the light striking the surface. A 100 kV, 3 ampere power supply 38 accelerates the photoelectrons towards resonator 32. In traversing a 1.5 cm gap between edges 34 and 36 in resonator 32 the electrons induce a radiofrequency field. Since the electrons traverse the gap every 2 nanoseconds, the resonator 32 is tuned to resonate at 500 MHz. The electrons are decelerated by the radiofrequency voltage across the gap 34 and 36 and exit the resonator with only a few kilovolts of energy and impinge upon the electron collector which is electrically shorted to a ground 50. In this apparatus, the photoemissive material 28 is the only component residing at high voltage. Radiofrequency power is removed from the resonator through a coupling loop and coaxial transmission line 60. The pressure within the enclosure 26 is maintained at less than $10^{-6}$ torr because oxygen is usually detrimental to photoemissive surfaces.

The various features and advantages of the invention are thought to be clear from the foregoing description. However, various other features and advantages not specifically enumerated will undoubtedly occur to those versed in the art, as likewise will many variations and modifications of the preferred embodiment illustrated, all of which may be achieved without departing from the spirit and scope of the invention as defined by the following claims.

What is claimed is:

1. A light modulated electron beam driven radiofrequency emitter for power generation comprising:

means for providing reduced atmospheric pressure of at least $10^{-6}$ torr for a selected enclosed environment;

a radiofrequency resonator having a selected resonant frequency and period disposed within said environment;

means for providing discrete pulses of light of duration less than about 15% of said resonant period of said radiofrequency resonator at said resonant frequency or a harmonic thereof;

photocathode means within said environment for receiving said light pulses and for generating a pulsed electron beam having a time structure essentially the same as said light pulses;

electrode means for accelerating said pulsed electron beam toward said resonator to increase kinetic energy of electrons present in the pulses of said beam, said pulsed electron beam passing through said resonator and interacting therewith, thereby converting the electron kinetic energy to radiofrequency fields within said resonator;

means for withdrawing radiofrequency power from said resonator by interacting coupling means with said radiofrequency fields; and means for transmitting said radiofrequency power out of said environment.

2. The invention of claim 1 further comprising means disposed within said environment for collecting electrons after their traverse of said resonator.

3. The invention of claim 2 further comprising means for preventing secondary electrons from returning to said resonator from said collecting means.

4. The invention of claim 1 wherein said light pulse providing means comprises a laser.

5. The invention of claim 4 wherein said light pulse providing means comprises means for modelocking said laser to form said pulses.

6. The invention of claim 5 wherein said modelocking means comprises an electrooptical modulator.

7. The invention of claim 5 wherein said modelocking means comprises an acoustooptical modulator.

8. The invention of claim 5 wherein said modelocking means comprises a passive dye cell.

9. The invention of claim 1 further comprising means for shifting the frequency of said light pulses disposed between said pulse providing means and said electron beam generating means.

10. The invention of claim 1 wherein said light pulse providing means is disposed externally of said enclosed environment and said environment providing means comprises means for allowing the passage of said light pulses into said environment.

11. The invention of claim 1 wherein said light pulse providing means is disposed within said environment.

* * * * *